United States Patent
Reynes et al.

(10) Patent No.: US 8,004,049 B2
(45) Date of Patent: Aug. 23, 2011

(54) POWER SEMICONDUCTOR DEVICE

(75) Inventors: Jean-Michel Reynes, Pompertuzat (FR); Stephane Alves, Toulouse (FR); Ivana Deram, Colomiers (FR); Blandino Lopes, Auzeville Tolosane (FR); Joel Margheritta, Seysses (FR); Frederico Morancho, Ramonville St. Agne (FR)

(73) Assignee: Freescale Semiconductor, Inc., Austin, TX (US)

( * ) Notice: Subject to any disclaimer, the term of this patent is extended or adjusted under 35 U.S.C. 154(b) by 462 days.

(21) Appl. No.: 11/574,478

(22) PCT Filed: Aug. 31, 2004

(86) PCT No.: PCT/EP2004/011074
§ 371 (c)(1), (2), (4) Date: Feb. 28, 2007

(87) PCT Pub. No.: WO2006/024322
PCT Pub. Date: Mar. 9, 2006

(65) Prior Publication Data
US 2009/0014792 A1    Jan. 15, 2009

(51) Int. Cl.
*H01L 27/088* (2006.01)

(52) U.S. Cl. . 257/401; 257/341; 257/342; 257/E29.257; 257/E21.418; 438/209; 438/212; 438/268

(58) Field of Classification Search .................. 257/341, 257/328, 329, 342, 401, E21.418, E29.257
See application file for complete search history.

(56) References Cited

U.S. PATENT DOCUMENTS

| | | | |
|---|---|---|---|
| 3,252,003 A | 5/1966 | Schmidt | |
| 4,003,072 A | 1/1977 | Matsushita et al. | |
| 4,134,123 A | 1/1979 | Shannon | |
| 4,651,181 A | 3/1987 | David | |
| 4,654,679 A | 3/1987 | Muraoka | |
| 4,823,176 A | 4/1989 | Baliga et al. | |
| 5,399,892 A | 3/1995 | Neilson et al. | |

(Continued)

FOREIGN PATENT DOCUMENTS
EP        0426252 B1    8/1994
(Continued)

OTHER PUBLICATIONS

Chen et al; "A Novel High-Voltage Sustaining Structure with Buried Oppositely Doped Regions"; IEEE Transactions on Electron Devices, vol. 47, No. 6, Jun. 2000.

(Continued)

*Primary Examiner* — Benjamin P Sandvik
*Assistant Examiner* — Farid Khan

(57) ABSTRACT

A device includes an array of cells, the source regions of the individual cells comprising a plurality of source region branches each extending towards a source region branch of an adjacent cell, the base regions of the individual cells comprising a corresponding plurality of base region branches merging together to form a single base region surrounding the source regions. The junctions between the merged base region and the drain region define rounded current conduction path areas for the on-state of the device between adjacent cells. Floating voltage regions of opposite conductivity type to the drain region are buried in the substrate beneath the merged base region. The features of the floating voltage regions define rings of the opposite conductivity type to the drain region that surround the current conduction paths of respective cells. The floating voltage regions include respective islands situated within the current conduction paths.

19 Claims, 5 Drawing Sheets

U.S. PATENT DOCUMENTS

| | | | |
|---|---|---|---|
| 5,438,215 A | 8/1995 | Tihanyi | |
| 5,521,410 A | 5/1996 | Yamamoto | |
| 5,631,484 A | 5/1997 | Tsoi et al. | |
| 5,703,389 A | 12/1997 | Knoch et al. | |
| 6,037,632 A | 3/2000 | Omura et al. | |
| 6,091,108 A | 7/2000 | Harris et al. | |
| 6,274,904 B1 | 8/2001 | Tihanyi | |
| 6,465,863 B1 | 10/2002 | Deboy et al. | |
| 6,639,278 B2 | 10/2003 | Sumida et al. | |
| 7,432,145 B2 | 10/2008 | Reynes et al. | |
| 2002/0005549 A1* | 1/2002 | Saito et al. | 257/328 |
| 2002/0096715 A1* | 7/2002 | Sumida et al. | 257/342 |
| 2003/0006473 A1 | 1/2003 | Rodov et al. | |
| 2006/0145252 A1* | 7/2006 | Reynes et al. | 257/341 |

FOREIGN PATENT DOCUMENTS

| | | | |
|---|---|---|---|
| EP | 1387408 A1 | 2/2004 | |
| FR | EP 1387408 | * | 2/2004 |
| JP | 1238173 A | 9/1989 | |
| WO | 98/32177 A1 | 7/1998 | |
| WO | 01/78152 A2 | 10/2001 | |
| WO | 03/030244 A1 | 4/2003 | |

OTHER PUBLICATIONS

Alves et al; "Vertical N-Channel FLIMOSFETs for Future 12 V/42 V Dual Batteries Automotive Applications"; IEEE 15th International Symposium on Power Semiconductor Devices and ICS Proceedings, Apr. 2003, pp. 308-311.

Saitoh, W. Omura et al., "Ultra low on-resistance SBD with p-buried floating layer," IEEE Proceedings of the 14th International Symposium on Power Semiconductor Devices and ICs, 2002, pp. 33-36.

* cited by examiner

POWER SEMICONDUCTOR DEVICE

FIELD OF THE INVENTION

This invention relates to a power semiconductor device and more particularly to a power semiconductor device comprising an array of cells distributed over a surface of a substrate, each cell having a source region formed at the substrate surface and surrounded in the substrate by a base region. A power semiconductor device of this kind is the subject of European patent specification EP 02 291 458.4.

BACKGROUND OF THE INVENTION

Semiconductor devices such as MOSFETs (Metal Oxide Semiconductor Field Effect Transistors) are used in power electronics applications due to their appreciable current carrying and off-state voltage blocking capability with low on-state voltage drop. In terms of industrial applications, power MOSFET devices are commonly used in many electronics fields such as portable electronics, power supplies, telecommunications and, especially, in many industrial applications relating to automotive electronics, particularly, but not exclusively, as switching devices.

Typically, a power MOSFET has a structure extending in the depth of a substrate in which a source, a base surrounding the source and a drain are of alternating p-type and n-type doping and an insulated gate layer is provided at the surface of the substrate. If the source and drain are n-type, and the base is p-type, for example, by applying a voltage higher than a threshold level which biases the gate positive with respect to the source, an n-type inversion layer or channel will be formed under a gate oxide insulating layer between the surface of the substrate and the gate thus forming an electrical connection between the source and the drain regions and allowing a current to flow in an on state of the device. Once the device is turned on, the electrical drain-source resistance is referred to as the on-state resistance ($R_{DSON}$) and should be as low as possible, especially in a switch device. High cell density vertical insulated gate FET (IGFET) devices, for example, with a cell density of several hundred thousand cells/cm$^2$, offer a particularly low on-state resistance per unit area at a low unit cost.

In the off-state, the voltage blocking capability is limited by the breakdown voltage. Typically, the design of a MOSFET device addresses the electrical isolation issue by arranging for each base cell region to be electrically isolated in an epitaxial layer. Ideally, all base regions should be at the same electrical potential in order to get a good snap back immunity while improving the breakdown voltage, likewise increasing the unclamped inductive switching (referred to as UIS) capability. To a large extent, the parameters favourable to high breakdown voltage are unfavourable to low on-state resistance.

Generally speaking, a need exists for further improving the compromise between on-state resistance and breakdown voltage, with a good electrical contact to a unique base region so as to guarantee the high energy capability (UIS), which need patent specification EP 02 291 458.4 addresses.

US patent specification U.S. Pat. No. 6,037,632 describes a MOSFET device in which, within the drain region of the substrate and parallel to its surface, a layer of opposite conductivity type is buried, comprising a plurality of strips functioning as current paths and set at a potential different from the electrodes of the device when a depletion layer reaches them.

Other semiconductor devices also are subject to compromises between on-state resistance and breakdown voltage. For example, international patent specification WO 01 78152 describes a Schottky diode device in which islands of opposite conductivity type are buried in a layer of a substrate in 'beds' spaced apart in the thickness of the layer. The article "Ultra Low On-Resistance SBD with P-Buried Floating Layer" by Wataru Saitoh, Ichiro Omura, Ken'ichi Tokano, Tsuneo Ogura and Hiromichi Ohashi published by the IEEE under the reference 0-7803-7357-X/02/$17.00 2002 IEEE also describes a Schottky barrier diode (SBD) structure with a buried electrically floating layer of opposite conductivity type and in the form of stripes or dots.

However, it is found that, in each of these cases, the solution proposed is sub-optimal as regards breakdown voltage.

SUMMARY OF THE INVENTION

The present invention provides a power semiconductor device as described in the accompanying claims.

DETAILED DESCRIPTION OF THE PREFERRED EMBODIMENTS

Although in the following description the layers and regions will be described as having certain conductivity types and being composed of certain materials, it will be appreciated that this is done by way of example only. The invention is applicable to other conductivity types and to other materials than those specifically referred to herein.

Figure 1:
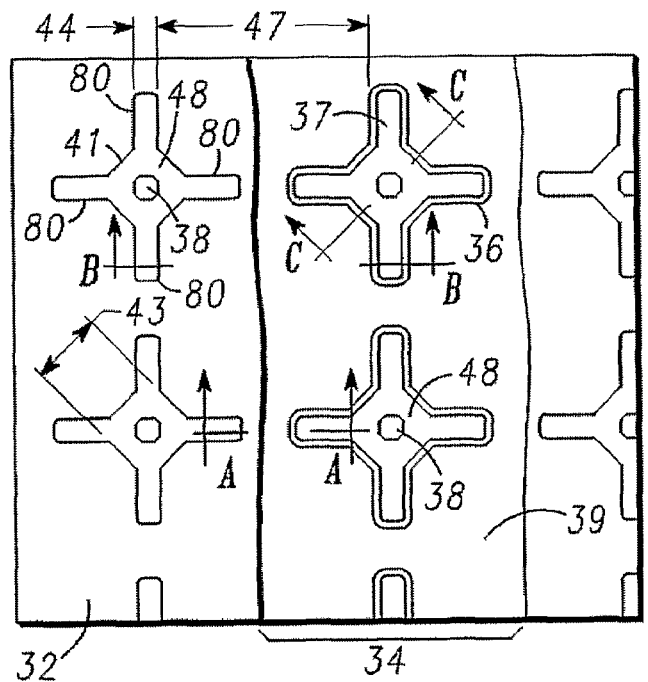
FIG. 1 is a top view of individual cells during manufacture of a power semiconductor device in accordance with one embodiment of the invention, given by way of example, before a base region merge operation.

FIG. 1 depicts in more detail a top view of individual cells of a semiconductor device according to an embodiment of the present invention at a stage in the manufacturing process before a merge operation. The cells are distributed over a surface of a substrate in an array, each cell having a source region formed at the substrate surface, a base region surrounding the source region in the substrate and a drain region surrounding the base region. This arrangement provides high channel density and low on-state resistance.

As is shown in FIG. 1, in this embodiment of the invention, the array is a rectangular array in which the cells are disposed in rows and columns. The source and base regions of each individual cell have four branches 80 each extending laterally outwards towards a similar branch 80 of an adjacent cell, the source region branches of adjacent cells presenting juxtaposed ends. The four branches of each individual cell are arranged so as to form the shape of a cross in this particular implementation but in other implementations a different number of radially extending branches are arranged differently.

The insulated gate comprises a polysilicon layer 32 insulated by an oxide layer (not seen in FIG. 1). A middle portion 34 of the device is shown in FIG. 1 with the insulated gate 32 removed, the lines in the middle portion 34 indicating transitions in dopant conductivity type such as from P-type to N-type or vice-versa. Each branch 80 of the cell includes a source region 37 within a separate base region 36 at this stage of the manufacturing process.

The base region 36 is a P-conductivity doped region in a semiconductor material that is used to provide a current channel, this structure being applicable to devices of the MOSFET, IGFET or an IGBT kinds. The current channel is controlled by the overlying insulated gate layer 32.

The drain region is common to all the cells of the array and extends laterally around and beneath the base regions 36. Instead of having a configuration where channels of individual cells are formed between the edge of source region 37 in the branches and the junction of base region 36 and common drain region, the semiconductor device of this embodiment of the present invention, like the devices described in patent specification EP 02 291 458.4, is configured so that the individual cells are aligned in an array with their base regions 36 connected to each other by a merge operation of adjacent PHV regions adjacent and between the juxtaposed ends of the branches 80 to form a single base region surrounding the source regions of the individual cells of the array in the substrate underneath the insulated gate 32. Merged base regions 36 referred to as the P High Voltage are also called the PHV or body regions.

More specifically, the source region branches of each cell each extend laterally outwards towards at least one source region branch of an adjacent cell, the source region branches of adjacent cells where they present juxtaposed ends. The base regions of the individual cells of the array comprise a corresponding plurality of base region branches each extending laterally outwards towards at least one base region branch of an adjacent cell, and the base region branches of adjacent cells are merged together adjacent and between the juxtaposed ends of the source region branches to form a single base region surrounding the source regions in the substrate.

Figure 2:
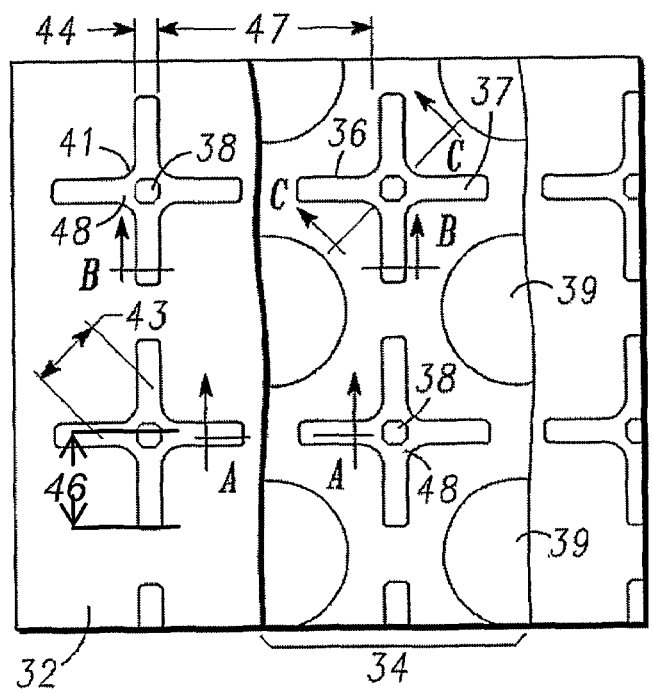
FIG. 2 is a top view of individual cells during manufacture of a power semiconductor device in accordance with another embodiment of the invention, given by way of example, after a base region merge operation.

In this embodiment of the invention, the four branches 80 of each individual cell are straight and are linked to each other by four segments 41, which are straight in the embodiment of FIG. 1 and are concave curved segments in the embodiment of FIG. 2. The concave curved segments 41 of FIG. 2 enable the breakdown voltage capability of the device to be increased by reducing electrical field concentration at sharp radiuses and facilitating obtaining a substantially constant radius for the rounded area of the PHV body region 36.

The four branches 80 are arranged in such a way that they have a width 44 that is less than width 43 which is the widest distance between radially opposed portions of insulated gate 32 even before the base region merge operation. Width 44 is the width of the source region 37 in each branch 80.

It will be appreciated that the structural dimensions of the individual cells depend on the operating voltage design range. In a preferred embodiment, width 44 in each branch 80 is of the order of a few microns or in a range from approximately 1 to 3.5 microns and width 43 between two parallel segments is approximately 0.5 to 2 microns greater than width 44. Each branch 80 has a length 46 less than 10 microns preferably in a range from 2.5 to 5 microns. Each parallel branch 80 is spaced apart with a distance 47; in the device of European patent specification EP 02 291 458.4, the distance 47 is in a range from approximately 3 to 7 microns with 4 to 5 microns preferred, in an embodiment of the present invention, as described below, this distance can be increased, for example to 8 microns. With these dimensions, insulated gate 32 can be wider than the width 44 of source region 37 in each branch 80.

In this embodiment of the invention, the branches 80 are preferably formed in the insulated gate 32 after the insulated gate has been deposited onto an underlying semiconductor material. After the four branches 80 are formed, the base region 36 is formed first followed by source region not only in the enlarged central area 48 but also in the branches 80. Both regions are formed by incorporating the appropriate dopant type (N-type or P-type) into the underlying semiconductor material.

Within each contact segment portion 41, doped contact regions 38 are surface contact areas for the base region situated within the central portion 48 of the source region that is within or bounded by contact segment portions 41. Doped contact region 38 is for example heavily doped P-type but generally with lighter dopant concentration than source region 37, and base region 36 is a more lightly doped P-type region.

Figure 3:
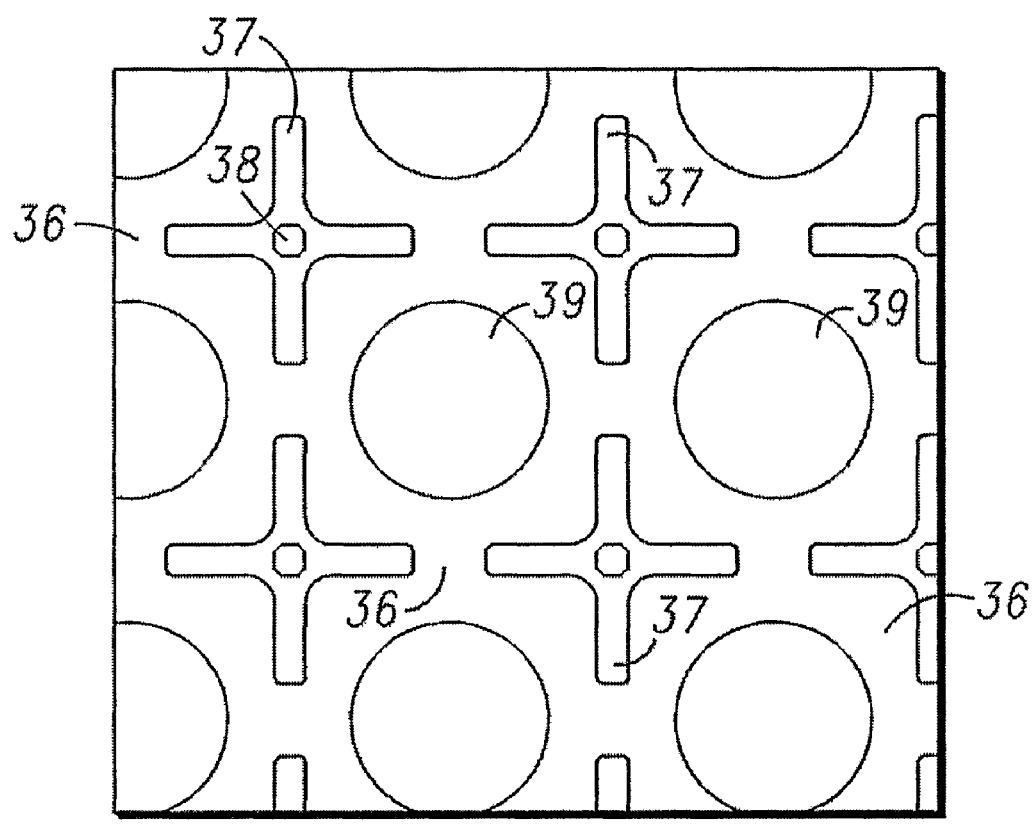
FIG. 3 is a top view of individual cells of the power semiconductor device of FIG. 2 after the base region merge operation.

FIG. 3 shows a top view of individual cells of the device of FIG. 2 after the merge operation within the adjacent base regions 36 between the ends of branches 80. After the merge operation, the initial array of separate base or PHV regions form a single matrix of base regions 36 whereas the laterally convex current conduction path areas 39 of the drain region remain physically separated laterally at the substrate surface even though they interconnect beneath the cells and have the same voltage applied to them. The merge operation between the adjacent base regions 36 of the embodiment of FIG. 1 produces a generally similar structure.

In the semiconductor device in accordance with the embodiments of the present invention described and shown in FIGS. 1 to 3, the specific cell openings in the continuous polysilicon gate layer 32 form the source region 37 and base regions, which base regions 36 are merged together by diffusion under the ends of branches 80 and thus form a continuous base region 36. The single base region 36 surrounds the source regions 37 of the individual cells of the array in the substrate, with junctions that laterally are solely concave between the merged base region and the drain region. The junctions define in the drain region rounded current conduction path areas 39 for the on-state of the device between adjacent cells, as shown in FIGS. 4 and 5, the current conduction paths 39 being depleted in the off-state of the device to block flow of current between the source regions and the drain electrode.

Figure 4:
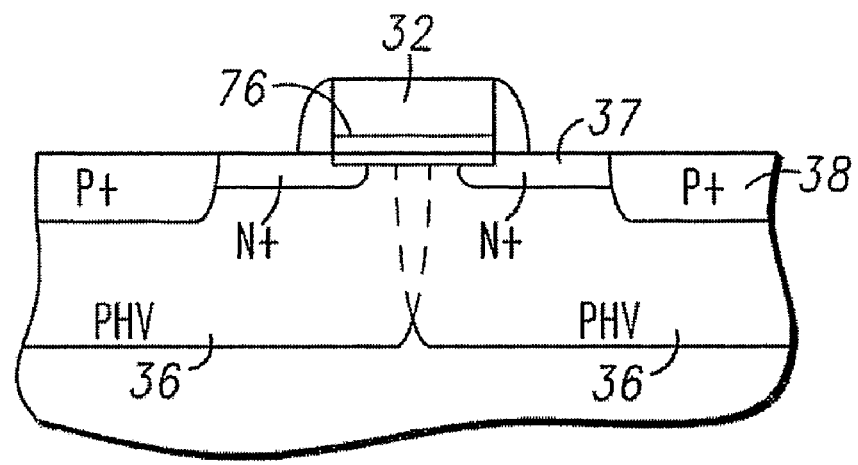
FIG. 4 is a simplified cross-sectional view of a portion of the power semiconductor devices taken along lines A-A of FIG. 1 and FIG. 2 showing the merged base region.
Figure 5:
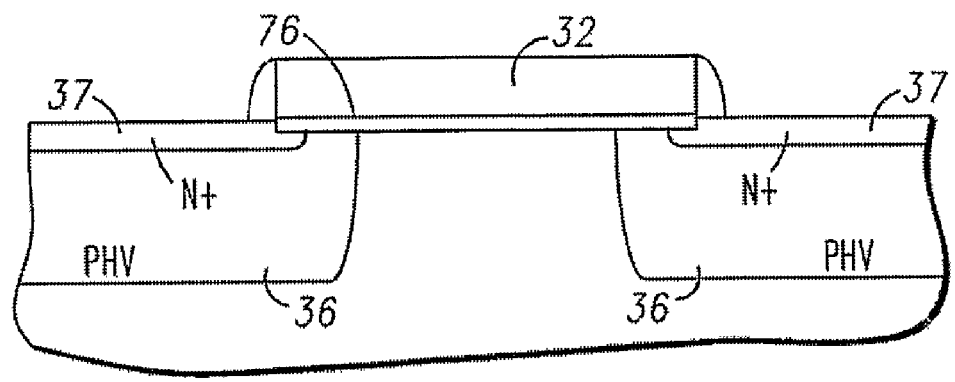
FIG. 5 is a simplified cross-sectional view of a portion of the power semiconductor devices taken along lines B-B of FIG. 1 and FIG. 2.

FIG. 4 represents a simplified cross-sectional view of a portion of a semiconductor device taken along line A-A of FIG. 1 between two juxtaposed ends of branches of two adjacent individual cells. Only the layers that are relevant to show the merged PHV regions resulting from the merging process of the PHV or base regions of each of the adjacent horizontal branches are shown in FIG. 4. The merge of the PHV regions at high temperature creates the contact continuity between all PHV regions of all branches so as to form the matrix of merged PHV regions. By having merged base or PHV regions, the phenomenon of parasitic NPN or PNP bipolarity (also called snap back effect) is avoided since the base region will always be polarised. Thus, the breakdown voltage is improved as well as the Unclamped Inductive Switching (UIS) such that the voltage and the current circulating between the individual cells can be sustained at a higher level.

This merge or diffusion is achieved by a process parameter optimisation in conjunction with the actual layout without requiring any extra mask layers. The merge or diffusion operation is performed in two steps: the implant of the PHV and the merge or diffusion itself.

The implant of the PHV or the base region requires the use of a correct doping dose. Once this step is completed, the process of merge or diffusion can start involving 2 parameters: time and temperature. For a merge or diffusion which lasts between 1 to 2 hours at 1100° C., the structural dimensions of the individual cells are such that for instance width 44 in each branch is between 1 to 3.5 microns. To some extent, the doping dose employed during the implant of the PHV will also affect the structural dimensions of the individual cells.

In another embodiment, instead of using masking and diffusion to obtain a single body region 36, another masking and implant step is added to merge the adjacent body regions of adjacent individual cells. This enables more flexibility in the choice of the width of the contact regions of the cells and, particularly in the case of high stand-off voltage devices, enables the contact continuity regions to be formed merged with a high level of uniformity and well rounded corners at the juxtaposed ends of the adjacent cell branches without needing a further drive (or lateral diffusion) step.

FIG. 5 represents a simplified cross-sectional view of a portion of the semiconductor device taken along line B-B of FIG. 1 and FIG. 2. As seen in FIG. 4, the merging process occurs at the position of the line A-A adjacent and between the juxtaposed ends of each two adjacent branches 80 of two adjacent individual cells whereas, as shown in FIG. 5, at the position of the line B-B, there is no merging of the PHV regions between two parallel branches of 2 adjacent individual cells.

Figure 6:
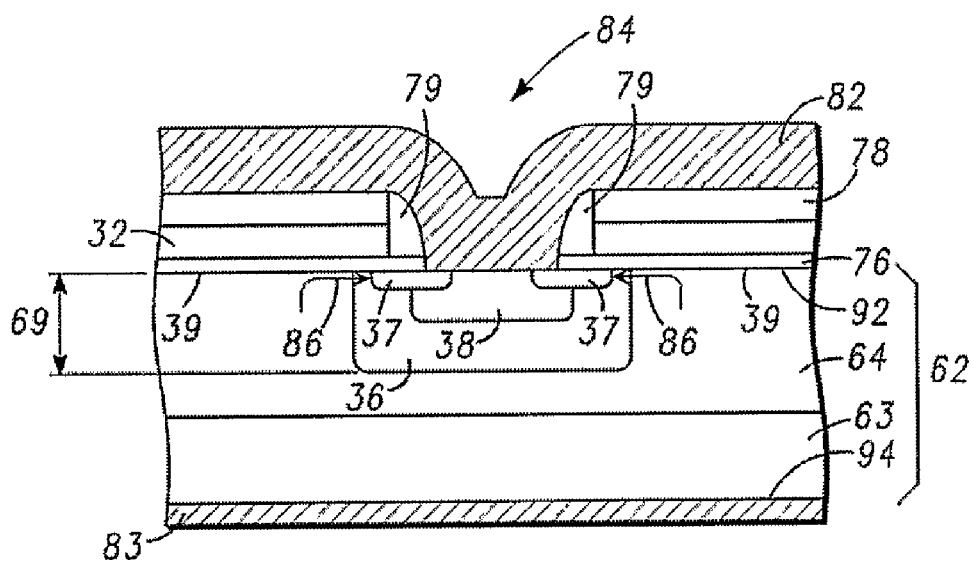
FIG. 6 is a simplified cross-sectional view taken along lines C-C of FIG. 1 and FIG. 2 of a portion of the power semiconductor devices.

FIG. 6 represents a cross-sectional view of a portion of the full depth of the semiconductor device taken along line C-C of an individual cell showing additional layers that have been formed for a finished MOSFET device.

As is shown in FIG. 6, the MOSFET device includes a drain electrode 83, a semiconductor substrate 62 having a first surface 92 and second surface 94 parallel to the first surface and is configured to conduct current between the first surface and the second surface.

Substrate 62 typically includes a first substrate layer 63 having a high dopant concentration and a second substrate layer 64 formed on the first substrate layer 63, the second layer 64 being of the same conductivity type as the first substrate layer 63, but more lightly doped. For example, in an N-channel MOSFET device, the first substrate layer 63 and second substrate layer 64 have an N-type conductivity. In a P-channel MOSFET device, the first substrate layer 63 and second substrate layer 64 have a P-type conductivity. Doped layer 64 has a dopant concentration that depends on the desired breakdown voltage characteristics of the finished device. In this embodiment of the invention, the thickness of the second substrate layer 64 is in a range from approximately 1 to 10 microns, for example. The second substrate layer 64 is formed using a method described below. That portion of the second substrate layer 64 around and below the base or PHV region 36 forms part of the common drain region 39.

The base or PHV region 36 is formed from the first surface of substrate 62 and extends to a depth 69 into substrate 62. Base or PHV region 36 is doped with a dopant having opposite conductivity type to the second substrate layer 64. For example, in a N-channel MOSFET device, base or PHV region 36 has a P-type conductivity. In a P-channel MOSFET device, base or NHV region 36 has an N-type conductivity. As mentioned earlier, NHV or PHV region 36 typically is referred to as the 'high voltage' region because of its breakdown characteristics. In this embodiment of the invention, NHV or PHV region has a doping surface profile with a depth 69 in the range of 1 micron, for example.

The source regions 37 in the branches 80 and in the central area 48 are formed within and surrounded by the base or PHV region 36, and extend to a depth less than depth 69. In this embodiment of the invention, the source regions have a depth in a range from 0.15 to 0.25 microns, for example. As seen in FIG. 6 along line C-C of FIG. 1, source region appears as having two portions within base or PHV region 36 because the cross-section is taken through the centre of one of contact segment portions 41. Source region 37 is doped with a dopant having the same conductivity type as the second substrate layer 64 and the first substrate layer 63.

Within contact segment portions 41, doped contact regions 38 are formed and extend into base or PHV region 36 to a depth of less than about one micron. Doped contact regions 38 are doped with a dopant having the same conductivity type as base or PHV region 36, but are doped to a higher dopant concentration than base or PHV region 36.

Gate oxide layer 76 is formed over a portion of source region of the central area 48, a portion of base or PHV region 36, and doped layer 64. Gate oxide layer 76 typically comprises a silicon oxide, has a thickness of several hundreds of angstroms depending on the operating voltage, and may be formed using well-known techniques. By using suitable processing techniques, insulated gate 32 is formed over gate oxide layer 76 and comprises for example a doped polycrystalline semiconductor material such as polysilicon.

Additional layers 78 are formed over insulated gate 32 using suitable techniques, and typically comprise a dielectric such as silicon oxide. Optionally, these additional layers 78 comprises a multilayer such as a silicon nitride layer formed on insulated gate region 32 and a silicon oxide layer formed on the silicon nitride layer.

Preferably, gate oxide layer 76, insulated gate region 32, and additional layer 78 are formed on substrate 62. The base or PHV region 36 is then formed in doped layer 64 followed by source regions 37 in the branches 80, using the layers produced as mask, as well as in the central area 48 and then doped contact region 38. The base or PHV region 36, source regions 37 and doped contact regions 38 are formed using, for example, ion implantation techniques.

A source ohmic layer or source electrode 82 is formed over the additional layer 78 and contacts both source region 37 and doped base contact region 38, short-circuiting the two together. Spacer regions 79, for example comprising silicon oxide, isolate source ohmic layer 82 from the insulated gate region 32. Spacer regions 79 may be formed by depositing a silicon oxide layer followed by an unmasked etching process to provide the structure as is shown in this figure.

Source ohmic layer 82 may comprise a metal layer with or without a barrier layer. A passivation layer can be formed on top of the MOSFET device.

Common drain ohmic layer or drain electrode 83 is formed over the second surface of substrate 62 and typically comprises a multilevel metallisation such as titanium/nickel/silver or the like. Arrows 86 show more clearly how current flows from drain region 37 into the current conduction paths 39 of the source region, the current then flowing through the drain region to the drain electrode 83.

Figure 7:
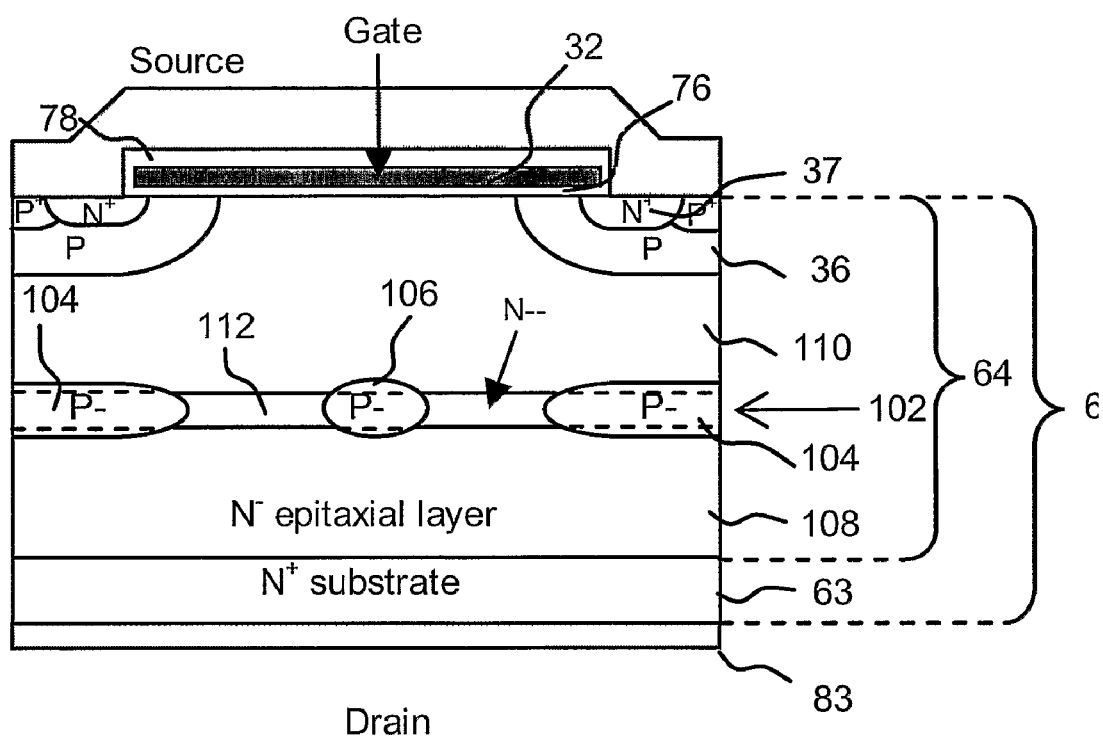
FIG. 7 is an enlarged cross-sectional view taken along lines C-C of FIG. 1 and FIG. 2 showing the structure of a substrate in the power semiconductor devices.
Figure 9:
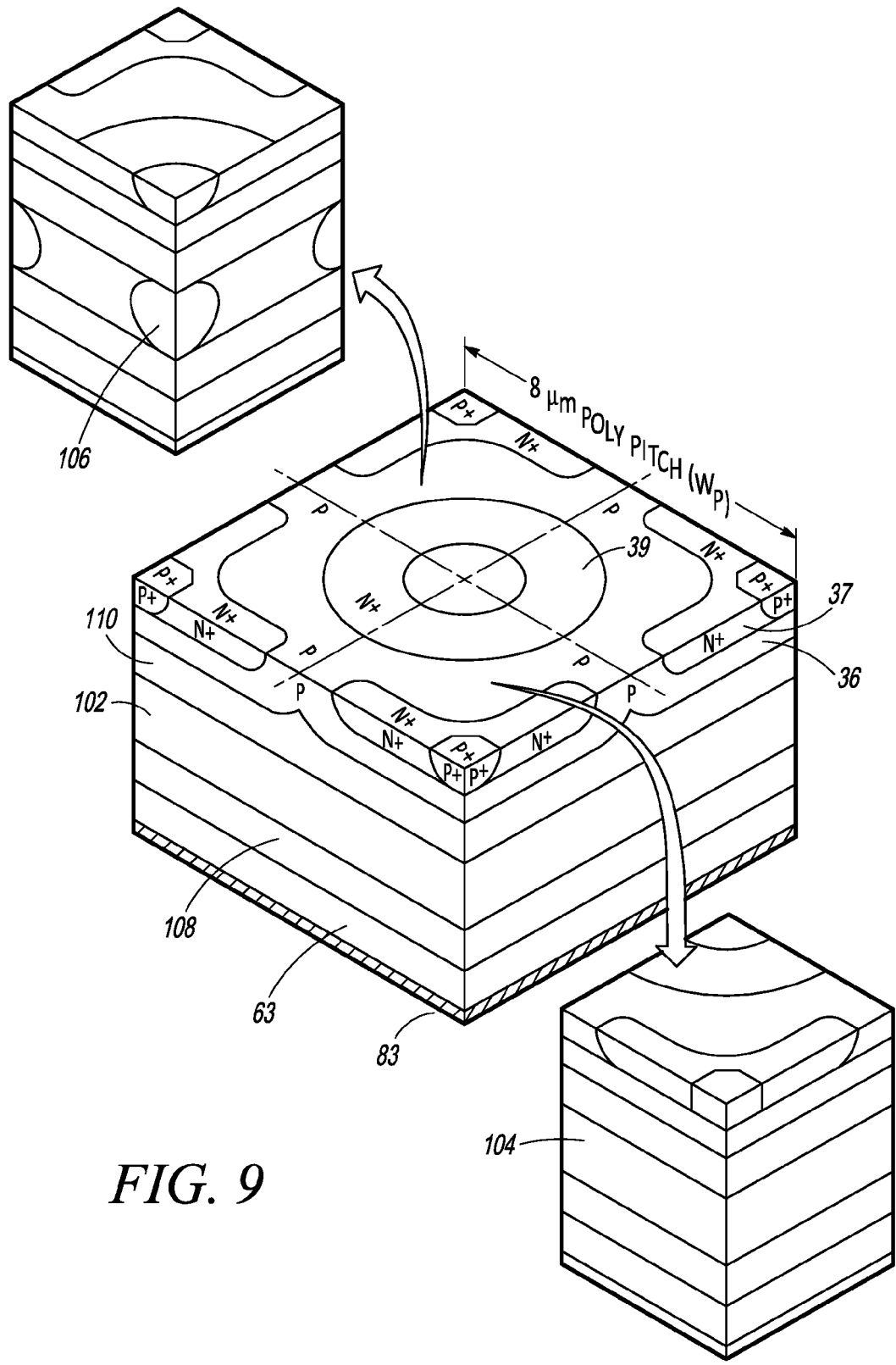
FIG. 9 is a perspective cut-out view of an element comprising adjacent parts of four adjacent cells in the device of FIG. 3, with detailed scrap perspective views of parts of the cells.

As shown in FIGS. 7 and 9, the second substrate layer 64 includes floating voltage regions of opposite conductivity type to the substrate, buried in the substrate 64 beneath the merged base region 36 and presenting features 102 corresponding to and juxtaposed with features of the merged base region in each cell. In operation in the off-state, when the depletion layers blocking the current conduction paths 39 reach the floating voltage regions 102, the voltage of the floating voltage regions is brought abruptly to the voltage of the source regions 37 by punch-through; a new depletion layer then forms beneath and adjacent to the floating voltage regions 102 whereby to enhance the development of the depletion layers in the drain region. Accordingly, the breakdown voltage of the device in the off-state for the same dimensions, geometry and dopant concentrations is increased. In turn this enables a reduction in the on-state resistance, since the dopant concentration of the drain region current conduction paths can now be increased while still maintaining a sufficient breakdown voltage. In summary, whatever the trade-off chosen between off-state breakdown voltage and on-state resistance by altering the various parameters, the overall compromise performance is improved by the addition of the floating voltage regions 102.

Figure 8:
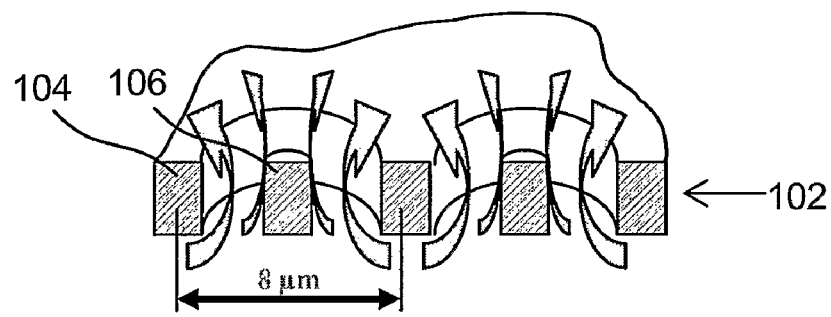
FIG. 8 is a schematic perspective view of a section of the substrate showing current flow in an embodiment of the invention.

In one embodiment of the invention, as shown in FIGS. 8 and 9, the floating voltage regions 102 present features 104 whose lateral shape is similar to the merged base regions 36, without necessarily being identical to them. In this embodiment, the features 104 are continuous and define rings of the opposite conductivity type to the drain region that surround the current conduction paths 39 between the adjacent cells.

In another embodiment of the invention, not shown in the drawings, the floating voltage regions 102 present an array of separate features whose lateral shape is similar to the shape of the source regions 37 and of the base regions 36 before the merging operation, the separate features of each cell being buried in the substrate beneath the merged base region and juxtaposed with corresponding features of the merged source and base region in each cell. In this embodiment, the separate features of the floating voltage regions 102 of adjacent cells partially surround the current conduction paths 39 between the adjacent cells.

In addition, in these embodiments of the invention, the floating voltage regions 102 include islands or plugs 106 of the opposite conductivity type to the drain region that are situated centrally within each of the current conduction paths 39. While the islands 106 restrict somewhat the cross-sectional area of the current conduction paths 39, which tends to increase the on-state resistance, they produce a much more significant increase in the off-state breakdown voltage, making a considerable positive contribution to the compromise between on-state resistance and off-state breakdown voltage. In particular, the cell lateral dimensions and especially the diameter of the current conduction paths 39 may be increased, much more than compensating the restriction of the cross-sectional area of the current conduction paths 39 by the islands 106 while still maintaining a sufficient breakdown voltage; for example, as shown in FIG. 8, the spacing 47 of adjacent cells may be 8 microns in this embodiment of the invention.

In this embodiment of the invention, the layer 64 of the substrate in fact comprises two layers 108 and 110, produced by successive steps of epitaxial growth on the layer 63. The floating regions 102 extend adjacent to the interface between the layers 108 and 110. In this embodiment of the invention, the floating regions 102 are produced by depositing or implanting p-type dopant on the layer 108 before the second epitaxial growth step produces the layer 110, or by very high energy implantation. Subsequent process steps cause the dopant at the interface to diffuse into the layers 108 and 110 on each side of the interface. It will be appreciated that the process parameters of all such subsequent process steps must be calculated and, if necessary adjusted, to take account of their effect on the dopant diffusion of the floating regions 102.

In one embodiment of the invention, as shown in FIG. 7, each of the current conduction paths 39 includes, adjacent the interface, a further layer 112 that is more lightly doped than the two layers 108 and 110 and is of the same conductivity type as the two layers 108 and 110. In the off-state, the layer 112 brings the depletion layer in the current conduction paths 39 deeper in the substrate and closer to the drain electrode 83, hence increasing the breakdown voltage. Although the addition of the lightly doped layer 112 tends to increase the on-state resistance, it is arranged to be thin and the effect is small compared with the improvement obtained in breakdown voltage by its addition. In one embodiment of the invention, the lightly doped layer 112 is produced by adjusting the parameters of deposition during the second epitaxial growth step. In another embodiment of the invention, the lightly doped layer 112 is produced by further epitaxial growth step prior to the second epitaxial growth step or by high energy implant It will be appreciated that the cross-sectional configuration of the base or PHV regions 36 can be modified to further enhance breakdown voltage characteristics of MOSFET devices. For example, the branches 80 of the individual cells may have various shapes as long as the base regions of the adjacent individual cells can merge at and adjacent juxtaposed ends of the respective branches without introducing convex lateral shapes at the base-drain junctions defining the current conduction paths 39.

Also, instead of having four branches 80 in each cell extending at right-angles to each other, other configurations may be chosen; for example each cell may have three branches extending at 120°, the branches of the cells forming a network with hexagonal sides surrounding the current conduction paths 39, like a honey comb. Alternatively, each cell may have more than four branches. For instance, in a configuration of individual cells with six branches extending at 60°, the branches of the cells form a network with triangular sides surrounding the current conduction paths 39.

The invention claimed is:

1. A power semiconductor device comprising an array of cells, each cell of the array comprising a source region formed at the substrate surface, a base region surrounding said source region in the substrate, a drain region underlying said source region and said base region, and a drain electrode contacting said drain region, a plurality of branches each extending laterally outwards towards at least one branch of an adjacent cell, the source regions in the branches of adjacent cells presenting juxtaposed ends, the base regions in the branches of the individual cells of the array comprising a corresponding plurality of base region branches each extending laterally outwards towards at least one base region in a branch of an adjacent cell, and the base regions in the branches of adjacent cells merging together adjacent and between said juxtaposed ends to form a single base region surrounding said source regions of the individual cells of said array in the substrate, with junctions that laterally are solely concave between the merged base region and the drain region defining a portion of a rounded current conduction path for the on-state of the device between adjacent cells that are depleted in the off-state of the device to block flow of current between the source regions and the drain electrode, and a floating voltage region of opposite conductivity type to said drain region, buried in the substrate, extending beneath said merged base region and presenting a portion of a floating voltage feature and a portion of a floating island, the floating voltage regions of adjacent cells merge together to define the floating voltage feature completely surrounding laterally said current conduction path, and wherein the floating island is situation within said conduction path.

2. A power semiconductor device as claimed in claim 1, wherein said floating voltage regions extend adjacent an interface between two layers of said substrate.

3. A power semiconductor device as claimed in claim 2, wherein each of said current conduction paths includes, adjacent said interface, a further layer that is more lightly doped than said two layers and is of a same conductivity type as said two layers.

4. A power semiconductor device as claimed in claim 2, wherein said two layers are epitaxial layers.

5. A power semiconductor device as claimed in claim 3, wherein said two layers are epitaxial layers.

6. A semiconductor device having a plurality of cells arranged in an array, the device comprising:
   a portion of the plurality of cells form a two-dimensional array, each cell of the two-dimensional array adjacent to each other cell of the two-dimensional array of cells, and each cell of the two-dimensional array comprising:
   a source region;
   a base region surrounding said source region;
   a drain region underlying the source region and the base region; and
   a floating voltage region buried in said drain region and of opposite conductivity type to said drain region, said floating voltage region presenting a portion of a first floating voltage feature that along with first floating voltage regions of each other cell of the two-dimensional array completely surrounds laterally a first current conduction path of said device for an on state.

7. A semiconductor device as claimed in claim 6, wherein said floating voltage region additionally presenting a portion of a first floating voltage island situated within said first current conduction path.

8. A semiconductor device as claimed in claim 7, wherein said floating voltage region presenting a portion of a second floating voltage feature that completely surrounds laterally a second current conduction path of said device for the on state, and said floating voltage region additionally presenting a portion of a second floating voltage island situation within said second current conduction path.

9. A semiconductor device as claimed in claim 8, wherein said floating voltage region is merged together with floating voltage regions of adjacent cells.

10. A device as claimed in claim 6, wherein said source region is at a first major surface of a substrate.

11. A device as claimed in claim 6, wherein said source region is at a first major surface of a substrate, and said drain region includes a drain contact at a second major surface of said substrate, said second major surface being located opposite and parallel to said first major surface.

12. A device as claimed in claim 6, wherein each one of said base regions comprise a plurality of base branches, each base branch extending laterally outwards towards a base branch of an adjacent cell and surrounding a corresponding source branch of said source region.

13. A device as claimed in claim 12, wherein each base branch is merged together with a corresponding base branch of an adjacent cell.

14. A device as claimed in claim 6, wherein a first portion of said drain region that is lateral to said floating voltage region has a lighter doping concentration than a second portion and a third portion of said drain region, said first portion being located between said second portion and said third portion.

15. A device as claimed in claim 6, wherein each cell has a pitch of at least approximately 8 micrometers.

16. A method of forming a semiconductor device comprising a plurality of cells arranged in an array the method comprising:
   forming a two-dimensional array of cells from a portion of the plurality of cells, each cell of the two-dimensional array of cells adjacent to each other cell of the two-dimensional array, and each cell of the two-dimensional array further formed by:
   forming a source region;
   forming a base region surrounding said source region;
   forming a drain region underlying the source region; and
   forming a floating voltage region buried in said drain region and of opposite conductivity type to said drain region, said floating voltage region presenting a portion of a first floating voltage feature that along with first floating voltage regions of each other cell of the two-dimensional array completely surrounds laterally a first current conduction path of said device for an on state.

17. A method as claimed in claim 16 wherein said floating voltage region additionally presenting a portion of a first floating voltage island situated within said first current conduction path.

18. The device of claim 6, wherein the two-dimensional array is a two-by-two array.

19. The method of claim 16, wherein the two-dimensional array is a two-by-two array.

* * * * *